United States Patent [19]

Adrian et al.

[11] 4,429,185

[45] Jan. 31, 1984

[54] VOLTAGE DETECTOR CIRCUIT

[75] Inventors: James M. Adrian, Naperville; Victor H. Mitnick, Lisle, both of Ill.

[73] Assignee: Bell Telephone Laboratories, Incorporated, Murray Hill, N.J.

[21] Appl. No.: 332,551

[22] Filed: Dec. 21, 1981

[51] Int. Cl.³ .................. H03K 17/16; H04B 3/46; H04M 3/22
[52] U.S. Cl. .................. 179/18 FA; 328/151
[58] Field of Search .......... 179/18 FA, 18 F, 18 HB, 179/18 AH, 1 MN, 78 R; 340/825.06; 328/150, 151

[56] References Cited

U.S. PATENT DOCUMENTS

| | | | |
|---|---|---|---|
| 3,312,787 | 4/1967 | Jorgensen | 179/18 HB X |
| 3,735,263 | 5/1973 | Boatwright | 368/118 |
| 4,022,980 | 5/1977 | Kitajewski et al. | 179/18 HB |
| 4,110,569 | 8/1978 | Schindler et al. | 179/84 A |
| 4,132,864 | 1/1979 | Feng | 179/18 FA |
| 4,158,109 | 6/1979 | Dijkmans et al. | 179/18 FA |
| 4,356,355 | 10/1982 | Ferrieu et al. | 179/18 HB |
| 4,362,908 | 12/1982 | Melindo | 179/18 HB |

*Primary Examiner*—Thomas W. Brown
*Attorney, Agent, or Firm*—K. H. Samples; R. T. Watland

[57] ABSTRACT

A voltage detector circuit for detecting a DC voltage on a line in the presence of a substantially fixed frequency AC voltage. The circuit may be used to detect call originations on a telephone line having longitudinal AC voltages induced thereon. The circuit compares the instantaneous voltage on the line with a reference level and repetitively increments a counter when the instantaneous voltage exceeds the reference level and repetitively decrements the counter when the instantaneous voltage does not exceed the reference level. After operating the counter for a time interval substantially equal to the period of the fixed frequency AC voltage, the most significant bit of the counter will indicate whether the DC voltage on the line is above the reference level. The circuit may also be used to detect call terminations on the line.

20 Claims, 4 Drawing Figures

VOLTAGE DETECTOR CIRCUIT

TECHNICAL FIELD

This invention relates to voltage detector circuits and, more particularly, to such circuits used to detect call organizations and call terminations on a telephone line.

BACKGROUND OF THE INVENTION

Telephone line supervision is typically accomplished by applying battery voltage to the line via feed resistors and comparing the voltage on the ring conductor to a predetermined reference level. A common problem which line supervision circuits must deal with is the presence of longitudinal AC voltages induced by nearby electrical power lines. A well-known approach to the problem involves filtering out these longitudinal voltages using an analog, resistor-capacitor filter network. However, the large size of the capacitor required to satisfactorily filter the power frequency imposes definite limits on the size and cost reductions that can be achieved for supervision circuits that rely on this approach. A second known approach, which deals with AC longitudinal rejection by measuring the differential voltage between the tip and ring conductors, is not applicable to ground start lines since only tip supervision is used for those lines. The present invention is a voltage detector circuit advantageously employing a digital technique to detect changes in DC voltage in the presence of a substantially fixed frequency AC voltage. The circuit of the invention can be readily implemented using integrated circuit technology to achieve substantial size and cost reductions over known voltage detectors.

SUMMARY OF THE INVENTION

A circuit in accordance with the present invention is used to detect the presence between two terminals of a DC voltage above a predetermined reference level regardless of the presence between the terminals of an AC voltage of a substantially fixed period. The circuit includes a comparator for sensing instantaneous voltage between the two terminals and generating an up signal when the instantaneous voltage exceeds the predetermined reference level. The circuit also includes apparatus responsive to the up signal for generating a voltage present signal when, over a time interval substantially equal to the product of a positive integer and the substantially fixed period of the AC voltage, the comparator has generated the up signal during more than one-half of the time interval.

BRIEF DESCRIPTION OF THE DRAWING

A more complete understanding of the present invention may be obtained from a consideration of the following description when read in conjunction with the drawing in which.

DETAILED DESCRIPTION

Figure 1:
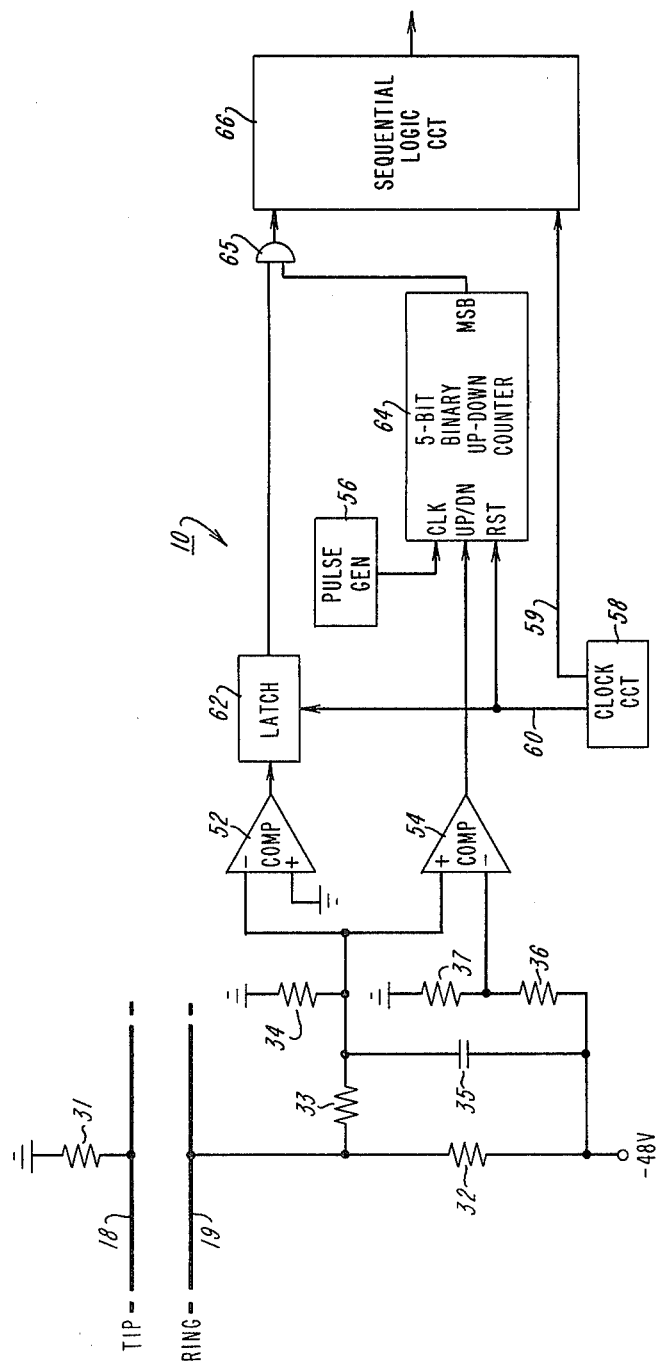
FIG. 1 is a circuit diagram of a voltage detector in accordance with the present invention.
Figure 3:
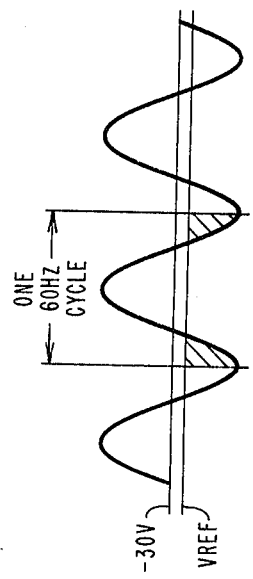
FIGS. 2, 3, and 4 illustrate various voltage waveforms pertinent to the voltage detector shown in FIG. 1.
Figure 2:
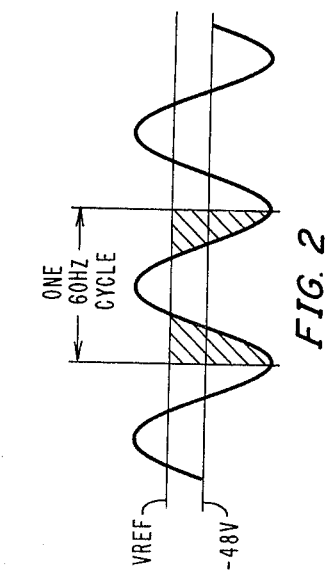

FIG. 1 is a circuit diagram of a voltage detector 10 embodying the present invention. In the example to be described, voltage detector 10 is used to detect call originations—i.e., on-hook to off-hook transitions—by a subscriber set (not shown) connected to a TIP conductor 18 and a RING conductor 19 of a telephone line. The grounded positive terminal and the negative terminal of a 48-volt battery are connected respectively to TIP conductor 18 and RING conductor 19 of the line via resistors 31 and 32. When the subscriber set is on-hook, RING conductor 19 remains at a DC potential of approximately −48 volts. When the subscriber set goes off-hook, current flows in the subscriber loop and the DC potential on RING conductor 19 becomes significantly less negative, e.g., −30 volts, the exact value depending on the resistance of the subscriber loop and the magnitudes of the leakage currents that flow between TIP conductor 18 and ground, between RING conductor 19 and ground, and between TIP conductor 18 and RING conductor 19. Voltage detector circuit 10 detects call originations at the subscriber set by detecting the resulting transition in DC potential on RING conductor 19. However, nearby 60-hertz AC electrical power lines may induce a 60-hertz AC voltage on the conductors of the telephone line. Accordingly, the potential on RING conductor 19 may be the superposition of the DC voltage corresponding to either an off-hook or an on-hook condition and a 60-hertz AC voltage. FIGS. 2 and 3 are typical waveform diagrams of the potential on RING conductor 19 under on-hook and off-hook conditions, respectively, when such a 60-hertz AC voltage is induced on the line. In FIGS. 2 and 3, a selected time interval having a duration equal to one 60-hertz period is shown and portions of that time interval during which the potential on RING conductor 19 is below a predetermined reference level, $V_{REF}$, are indicated by shading. For the on-hook condition (FIG. 2) the voltage on RING conductor 19 is below $V_{REF}$ for more than one-half of the time interval. Conversely, for the off-hook condition (FIG. 3) the voltage on RING conductor 19 is below $V_{REF}$ for less than one-half of the time interval. The same results obtain independent of the position of the selected time interval relative to the 60-hertz voltage waveform on RING conductor 19 and for any selected time interval having a duration equal to an integer multiple of one 60-hertz period. Voltage detector circuit 10 detects the off-hook status of the line by comparing the instantaneous voltage on RING conductor 19 with $V_{REF}$ over one 60-hertz period and determining when the voltage on RING conductor 19 is below $V_{REF}$ for less than one-half of that period. Although voltage detector 10 is used in the present example to detect voltages between RING conductor 19 and ground, it can be used more generally to detect voltages between any two terminals.

The comparison of the instantaneous voltage on RING conductor 19 with $V_{REF}$ is implemented in voltage detector 10 using a voltage comparator 54, two resistors 33 and 34 connected in series between RING conductor 19 and ground, and two resistors 36 and 37 connected in series between the negative terminal of the 48-volt battery and ground. The junction between resistors 33 and 34 is connected to a non-inverting input terminal of comparator 54 and the junction between resistors 36 and 37 is connected to an inverting input terminal of comparator 54. The voltage at the junction of resistors 33 and 34 is proportional to the voltage on RING conductor 19 and the voltage at the junction of resistors 36 and 37 is proportional to predetermined reference level $V_{REF}$. The resistance values of resistors 33, 34, 36 and 37 are selected such that comparator 54 draws very little current from RING conductor 19 and such that comparator 54 generates a logic one signal, referred to as an up signal, when the instantaneous voltage on RING conductor 19 exceeds $V_{REF}$ and comparator 54 generates a logic zero signal, referred to as a down signal, when the instantaneous voltage on RING conductor 19 does not exceed $V_{REF}$. A capacitor 35 is connected between the negative terminal of the 48-volt battery and the junction between resistors 33 and 34 to filter out high frequencies. The physical size of capacitor 35 can be very small compared to the size of capacitors used to implement known power-frequency filters.

The signals generated by comparator 54 are transmitted to an up/down control input terminal of a five-bit binary up/down counter 64 used to generate a signal when, over a 60-hertz period, the instantaneous voltage on RING conductor 19 has been below $V_{REF}$ for less than one-half of the period. During times when comparator 54 is generating an up signal, counter 64 is incremented by one for each pulse received at its clock input terminal from an 800-hertz pulse generator 56. Counter 64 is decremented by one for each pulse received from pulse generator 56 during times when comparator 54 is generating a down signal. Counter 64 is reset once every 60-hertz period by a 60-hertz clock signal generated by a clock circuit 58 on a conductor 60. Because of the frequency relationship between the pulses generated by pulse generator 56 and the clock signal generated by clock circuit 58 on conductor 60, counter 64 will receive at most 14 pulses before being reset. If counter 64 is incremented for 14 pulses after being reset, its binary count will take on successive values of the sequence (00000, 00001, 00010, . . . 01110). Further, if counter 64 is decremented for 14 pulses after being reset, its binary count will taken on successive values of the sequence (00000, 11111, 11110, . . . 10010). Accordingly, immediately before being reset the most significant bit of the binary count of counter 64 will be a logic zero if counter 64 is not decremented more during a given 60-hertz cycle than it is incremented and will be a logic one if counter 64 is decremented more during a given 60-hertz cycle than it is incremented. The most significant bit of the binary count of counter 64 is represented by the voltage at an MSB output terminal of counter 64. A logic zero at the MSB output terminal of counter 64 at the end of a 60-hertz cycle is referred to as a voltage present signal. Further, a logic one at the MSB output terminal of counter 64 at the end of a 60-hertz cycle is referred to as a voltage absent signal. The frequency of pulse generator 56 is chosen depending on the voltage resolution required for voltage detector 10. For example, in order to detect a DC voltage which is close to $V_{REF}$, the frequency of pulse generator 56 may have to be increased such that the number of pulses generated during the portion of the 60-hertz period when comparator 54 is generating an up signal differs from the number of pulses generated during the portion of the 60-hertz period when comparator 54 is generating a down signal. However, if the frequency of pulse generator 56 is increased to provide finer resolution, the maximum number, N, of pulses generated during one 60-hertz period will increase and counter 64 may have to be modified to have an increased number of bits. Counter 64 may be implemented as two four-bit binary up/down counters interconnected in a well-known manner. In accordance with the present example, only five of the eight bits available with such an implementation are needed and voltages representing the two possible values of the most significant of those five bits are used as the voltage present signal and the voltage absent signal. In general, any one of the available bits that is not required for any of the binary numbers representing the positive integers from one through N can be used.

Figure 4:
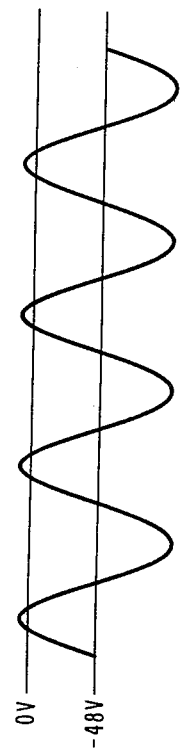

A second voltage comparator 52 is included in the implementation of voltage detector 10 to detect large AC voltages on RING conductor 19. Such large AC voltages are to be treated by voltage detector 10 as call originations so that line testing can be initiated. An inverting input terminal of comparator 52 is connected to the junction between resistors 33 and 34 and a non-inverting input terminal of comparator 52 is grounded. When the instantaneous voltage on RING conductor 19 exceeds zero volts (FIG. 4), comparator 52 generates a logic zero; otherwise it generates a logic one. If comparator 52 generates a logic zero at any time during a given 60-hertz period, a logic zero is stored at an output terminal of a latch 62. A logic zero at the output terminal of latch 62 is referred as an excessive voltage signal. Latch 62 is reset by the 60-hertz clock signal generated by clock circuit 58 on conductor 60.

The signals generated by counter 64 and latch 62 could be used individually to provide indications of the presence of a DC voltage and the presence of an excessive AC voltage. However, in the circuit of the present example, the signals generated by counter 64 and latch 62 are combined by an AND gate 65 to generate a single indicating signal. A logic zero at the output of AND gate 65 at the end of a 60-hertz cycle indicates the presence of a DC voltage or an excessive AC voltage or both.

To reduce the likelihood that noise or "hits" on RING conductor 19 will result in false indications, the indicating signals generated by AND gate 65 is transmitted to a sequential logic circuit 66. Logic circuit 66 is sequenced by a 60-hertz clock signal generated by clock circuit 58 on a conductor 59. The clock signal generated by clock circuit 58 on conductor 60 is slightly delayed with respect to the clock signal on conductor 59 such that logic circuit 66 is sequenced before counter 64 and latch 62 are reset. Logic circuit 66, which comprises two flip-flops (not shown), uses a well-known "last-look" method to generate an off-hook signal indicating the off-hook status of the line or the presence of excessive AC voltage on the line when the indicating signal generated by AND gate 65 has been at logic zero at the end of two consecutive cycles. The off-hook signal generated by logic circuit 66 may be used to signal a telephone switching system (not shown) of a request for service by a subscriber set (not shown) connected to TIP conductor 18 and RING conductor 19.

Voltage detector 10 can be implemented for detecting call terminations by using logic circuit 66 to generate an on-hook signal when the MSB output terminal of counter 64 and the output terminal of latch 62 have both been at logic one at the end of two consecutive cycles. In that case, the on-hook signal generated by logic circuit 66 may be used to signal the telephone switching system (not shown) of call termination.

It is to be understood that the above-described embodiment is merely illustrative of the principles of the invention and that other embodiments may be devised by those skilled in the art without departing from the spirit and scope of the invention. Voltage detector circuit 10 can be implemented for detecting the presence between two terminals of a DC voltage above a predetermined reference level regardless of the presence between the terminals of a 50-hertz AC voltage, for example, by modifying clock circuit 58 to generate 50-hertz clock signals.

What is claimed is:

1. A circuit for detecting the presence between two terminals of a DC voltage above a predetermined reference level regardless of the presence between said terminals of an AC voltage of a substantially fixed period, said circuit comprising comparator means for sensing instantaneous voltage between said two terminals and generating an up signal when said instantaneous voltage exceeds said predetermined reference level, and means responsive to said up signal for generating a voltage present signal when, over a time interval substantially equal to the product of a positive integer and said period, said comparator means has generated said up signal during more than one-half of said time interval.

2. A circuit for detecting the presence between two terminals of a DC voltage above a predetermined reference level regardless of the presence between said terminals of an AC voltage of a substantially fixed period, said circuit comprising comparator means for sensing instantaneous voltage between said two terminals and generating a down signal when said instantaneous voltage does not exceed said predetermined reference level, and means responsive to said down signal for generating a voltage present signal when, over a time interval substantially equal to the product of a positive integer and said period, said comparator means has generated said down signal during less than one-half off said time interval.

3. A circuit for detecting the presence between two terminals of a DC voltage above a first predetermined reference level regardless of the presence between said terminals of an AC voltage of a substantially fixed period, said circuit comprising first comparator means for sensing instantaneous voltage between said two terminals and generating an up signal when said instantaneous voltage exceeds said first predetermined reference level and generating a down signal when said instantaneous voltage does not exceed said first predetermined reference level, pulse generator means for generating pulses, and signal generator means responsive to said up signal, said down signal and said pulse for generating a voltage present signal when, over a time interval substantially equal to the product of a positive integer and said period, the number of pulses generated by said pulse generator means during times when said first comparator means is generating said up signal is not less than the number of pulses generated by said pulse generator means during times when said first comparator means is generating said down signal.

4. A circuit in accordance with claim 3 wherein said signal generator means includes means for storing a numerical representation, means for incrementing said numerical representation by one for each pulse generated by said pulse generator means during times when said first comparator means is generating said up signal, means for decrementing said numerical representation by one for each pulse generated by said pulse generator means during times when said first comparator means is generating said down signal and means for setting said numerical representation to zero at the end of said time interval.

5. A circuit in accordance with claim 4 wherein said numerical representation is a binary number comprising a plurality of bits and said voltage present signal is generated when at least a predetermined one of said plurality of bits is a given logical value at the end of said time interval and immediately before said numerical representation is set to zero.

6. A circuit in accordance with claim 5 wherein said pulse generator means generates at most a given number, N, of pulses during said time interval and wherein said at least a predetermined one of said plurality of bits remains a logic zero as said numerical representation is incremented by one N times after being set to zero.

7. A circuit in accordance with claims 1, 2, 3, 4, 5 or 6 wherein at least one of said two terminals is electrically connected to a telephone line.

8. A circuit in accordance with claims 3, 4, 5 or 6 further comprising means for generating an off-hook signal when said signal generator means generates said voltage present signal twice corresponding to two consecutive time intervals each substantially equal to said product of said positive integer and said period.

9. A circuit in accordance with claims 3, 4, 5 or 6 further comprising second comparator means for generating a excessive voltage signal when, at any time during said time interval, said instantaneous voltage has exceeded a second predetermined reference level.

10. A circuit in accordance with claim 9 further comprising means for generating an off-hook signal when said signal generator means generates said voltage present signal twice corresponding to two consecutive time intervals each substantially equal to said product of said positive integer and said period and for generating said off-hook signal when said second comparator means generates said excessive voltage signal twice corresponding to said two consecutive time intervals.

11. A circuit for detecting the absence between two terminals of a DC voltage above a predetermined reference level regardless of the presence between said terminals of an AC voltage of a substantially fixed period, said circuit comprising comparator means for sensing instantaneous voltage between said two terminals and generating an up signal when said instantaneous voltage exceeds said predetermined reference level, and means responsive to said up signal for generating a voltage absent signal when, over a time interval substantially equal to the product of a positive integer and said period, said comparator means has generated said up signal during less than one-half of said time interval.

12. A circuit for detecting the absence between two terminals of a DC voltage above a predetermined reference level regardless of the presence between said terminals of a AC voltage of a substantially fixed period, said circuit comprising comparator means for sensing instantaneous voltage between said two terminals and generating a down signal when said instantaneous voltage does not exceed said predetermined reference level, and means responsive to said down signal for generating a voltage absent signal when, over a time interval substantially equal to the product of a positive integer and said period, said comparator means has generated said down signal during more than one-half of said time interval.

13. A circuit for detecting the absence between two terminals of a DC voltage above a predetermined reference level regardless of the presence between said terminals of an AC voltage of a substantially fixed period, said circuit comprising
   first comparator means for sensing instantaneous voltage between said two terminals and generating an up signal when said instantaneous voltage exceeds said predetermined reference level and generating a down signal when said instantaneous voltage does not exceed said predetermined reference level,
   pulse generator means for generating pulses, and signal generator means responsive to said up signal, said down signal and said pulses for generating a voltage absent signal when, over a time interval substantially equal to the product of a positive integer and said period, the number of pulses generated by said pulse generator means during times when said first comparator means is generating said up signal is less than the number of pulses generated by said pulse generator means during times when said first comparator means is generating said down signal.

14. A circuit in accordance with claim 13 wherein said signal generator means includes means for storing a numerical representation, means for incrementing said numerical representation by one for each pulse generated by said pulse generator means during times when said first comparator means is generating said up signal, means for decrementing said numerical representation by one for each pulse generated by said pulse generator means during times when said first comparator means is generating said down signal and means for setting said numerical representation to zero at the end of said time interval.

15. A circuit in accordance with claim 14 wherein said numerical representation is a binary number comprising a plurality of bits and said voltage absent signal is generated when at least a predetermined one of said plurality of bits is a given logical value at the end of said time interval and immediately before said numerical representation is set to zero.

16. A circuit in accordance with claim 15 wherein said pulse generator means generates at most a given number, N, of pulses during said time interval and wherein said at least a predetermined one of said plurality of bits remains a logic zero as said numerical representation is incremented by one N times after being set to zero.

17. A circuit in accordance with claims 11, 12, 13, 14, 15 or 16 wherein at least one of said two terminals is electrically connected to a telephone line.

18. A circuit in accordance with claims 13, 14, 15 or 16 further comprising means for generating an on-hook signal when said signal generator means generates said voltage absent signal twice corresponding to two consecutive time intervals each substantially equal to said product of said positive integer and said period.

19. A method of detecting the presence between two terminals of a DC voltage above a predetermined reference level regardless of the presence between said terminals of an AC voltage of a substantially fixed period, said method comprising
   sensing instantaneous voltage between said two terminals and generating an up signal when said instantaneous voltage exceeds said predetermined reference level and generating a down signal when said instantaneous voltage does not exceed said predetermined reference level,
   generating pulses,
   storing a numerical representation,
   incrementing said numerical representation by one for each of said pulses generated during times when said up signal is being generated,
   decrementing said numerical representation by one for each of said pulses generated during times when said down signal is being generated, and
   setting said numerical representation to zero at the end of a time interval substantially equal to the product of a positive integer and said period.

20. A method in accordance with claim 19 wherein at least one of said two terminals is electrically connected to a telephone line.

* * * * *